United States Patent [19]

Kwiatkowski et al.

[11] Patent Number: 4,706,222
[45] Date of Patent: Nov. 10, 1987

[54] DARLINGTON TYPE SWITCHING STAGE FOR A LINE DECODER OF A MEMORY

[75] Inventors: Jean-Claude Kwiatkowski, Caen; Guy Imbert, Hermanville/Mer, both of France

[73] Assignee: U.S. Philips Corporation, New York, N.Y.

[21] Appl. No.: 852,052

[22] Filed: Apr. 15, 1986

[30] Foreign Application Priority Data

Apr. 16, 1985 [FR] France ................... 85 05702

[51] Int. Cl.$^4$ .............................................. G11C 11/40
[52] U.S. Cl. ................................... 365/230; 365/241; 307/315; 307/463
[58] Field of Search ............... 307/315, 454, 463, 239, 307/280, 300, 456; 365/189, 230, 242, 243, 241

[56] References Cited

U.S. PATENT DOCUMENTS

| 3,533,007 | 10/1970 | Segar | 307/315 |
| 4,236,089 | 11/1980 | Baker | 307/315 |
| 4,347,586 | 8/1982 | Natsui | 365/230 |
| 4,394,657 | 7/1983 | Isogai et al. | 365/230 |
| 4,488,263 | 12/1984 | Herdorn et al. | 307/463 |
| 4,603,268 | 7/1986 | Davis | 307/315 |

FOREIGN PATENT DOCUMENTS 0053504  6/1982  European Pat. Off. ............ 365/189

OTHER PUBLICATIONS

B. Cassidy, "Pulse Power Voltage Driver Circuit", Dec. 1972, IBM Technical Disclosure Bulletin–vol. 15, No. 7.
Inadachi, "A GnS 4kb Bipolar Ram–Memory Cell", Feb. 15, 1979, IEEE–International Solid-State Conference–pp. 108–109.

Primary Examiner—Stanley D. Miller
Assistant Examiner—Tai Van Duong
Attorney, Agent, or Firm—Robert T. Mayer; Bernard Franzblau

[57] ABSTRACT

A switching stage receives two levels at its input, i.e. a high selection level and a low non-selection level. The Darlington stage ($T_1$, $T_2$) supplies at its output (E) a high current in the selected mode and a considerably smaller current in the non-selected mode. In order to accelerate the evacuation of charges accumulated in the base of $T_2$ and hence the deselection time of the stage, an auxiliary current source (I), is connected to a point A. Between the base (B) of the transistor $T_2$ and the point A two diodes ($D_1$, $D_2$) are connected in series in the forward direction. Between the emitter (E) of $T_2$ and the point A a diode ($D_3$) is connected in the forward direction. In the selected mode, the major part of the current I passes through $D_1$, $D_2$ and this current permits the evacuation of the charges from the base of the transistor $T_2$ when the stage is deselected.

12 Claims, 5 Drawing Figures

4,706,222

DARLINGTON TYPE SWITCHING STAGE FOR A LINE DECODER OF A MEMORY

BACKGROUND OF THE INVENTION

This invention relates to a switching stage of the Darlington type comprising a first transistor having a base, which constitutes the input of the stage, adapted to receive a control signal, whose voltage varies between a so-called selection level and a so-called non-selection level. The emitter of the first transistor acts upon the base of a second transistor whose emitter, which constitutes the output of the stage, is adapted to be connected to a first current source when the said logic control signal is at its selection level and to a second current source of lower intensity than the first source when the said logic control signal is at its non-selection level.

Such a switching stage is currently used as an output stage, i.e. one per line of a line decoder of a high-speed memory. The selected line is traversed by a considerable selection current and the other lines are traversed by a hold current which is markedly smaller.

During a loading of addresses at the input of the decoder corresponding to the selection of a different line, the current in the line, which is deselected, passes for a period designated as the deselection time from a high current level to a considerably lower level, and vice versa for a period designated as the selection time for the line which is selected, the other lines remaining at the same current level.

It is well known to those skilled in the art that the deselection time is longer than the selection time.

The memory access time is consequently especially determined by the capacitance of the output stages of the decoder in order to ensure that this current decrease is obtained in a minimum period of time.

SUMMARY OF THE INVENTION

An object of the invention is to shorten the non-selection time of the lines by using a circuit adapted to facilitate the evacuation of the charges accumulated in the base of the second transistor constituting the output transistor of the Darlington stage.

The basic idea of the invention consists in the use of an auxiliary current source for each line and two branches connected thereto and controlled so that the auxiliary current is routed for the major part of the first branch when the corresponding line is selected, the first branch also being connected to the base of the output transistor of the Darlington stage. The current passing through the first branch is adapted to activate the voltage decrease at the output of the Darlington stage due to the contribution to the evacuation of the charges from the base of the output transistor of the Darlington stage.

On the other hand, when the line is deselected, the major part of the auxiliary current passes through the second branch, which permits of increasing the emitter current of the transistor $T_2$ and of avoiding, as will be illustrated hereinafter, an excessively large reduction of the difference between the high level and the low level at the emitter of the output transistor of the Darlington stage.

The invention is therefore characterized in that there are disposed between the base of the second transistor and the said auxiliary current source, whose intensity lies between the intensities of the two first current sources, a first and a second diode in series arrangement and the forward direction, which constitute the said first branch, and in that there is disposed between the emitter of the second transistor and the said auxiliary current source a third diode in the forward direction constituting the said second branch.

The current of the auxiliary current source is advantageously larger than or equal to 10% of the current of the second current source in order to ensure that the charges of the second transistor are effectively evacuated.

In the case where the switching stage according to the invention is used as an output stage of the line selection modules of a line decoder of a memory having n lines comprising n selection modules each supplying a logic output signal, the logic output signal of one of the said modules selected by an address introduced into the decoder being at its high level and the logic output signals of the remaining (n−1) modules being at their low level, the invention is characterized in that the logic output signal of each of the modules is introduced at the input of a stage such as defined above and its output is connected to a line selection conductor of the memory.

BRIEF DESCRIPTION OF THE DRAWINGS

In order that the invention may be readily carried out, it will now be described more fully, by way of example, with reference to the accompanying drawings, in which.

DESCRIPTION OF THE PREFERRED EMBODIMENTS

Figure 1:
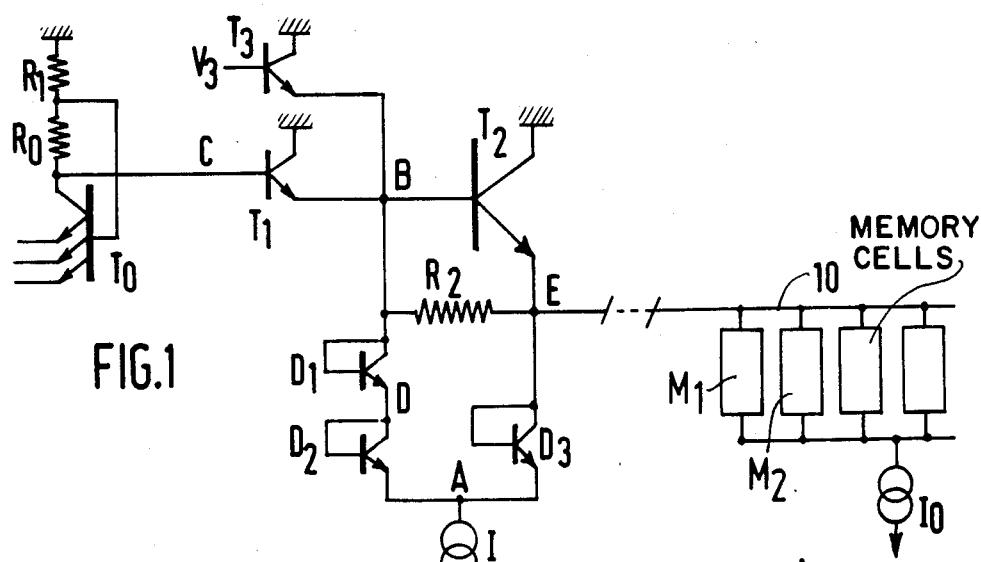
FIG. 1 shows an embodiment of the invention in a line decoder of a memory.

FIG. 1 shows a module for decoding the address of a given line of a memory. The number of modules and the number of lines in the memory are equal. The decoding arrangement is of the type comprising diodes and is constituted by a multi-emitter NPN transistor $T_0$, whose base is coupled to the collector either directly or, as shown, through a resistor $R_0$. A resistor $R_1$ is disposed between the collector of $T_0$ and ground and is in series with the resistor $R_O$ if the latter is present. The emitters of the transistor $T_O$ are connected in known manner to address lines so that the transistor $T_O$ can recognize an address displayed at the input of the decoder and corresponding to the selection of the said line. When the said line is thus selected, the transistor $T_O$ is cut off and no current at all flows through the resistors $R_O$ and $R_1$. The collector of the transistor $T_0$ is then at ground potential (the high level). For all the other addresses, which correspond to the bases in which the said line is non-selected, the transistor $T_O$ is connected in the forward direction through one minus one of its emitters and is traversed by a given current I. The collector of the transistor $T_0$ is then at the potential $-(R_0+R_1)I$ (the low level).

Since the selected line of the memory consumes a comparatively large current, for each module an output stage is generally used comprising two NPN transistors $T_1$ and $T_2$ connected in Darlington configuration. The input transistor $T_1$ is connected through its base to the collector of the transistor $T_O$ and through its collector to ground. The output transistor $T_2$ has large dimensions with respect to $T_1$ and is connected through its collector to ground and through its emitter to the corresponding line conductor 10 of the memory.

When the line is selected, that line of the memory cells $M_1$, $M_2$ ... selected by column conductors is traversed by a comparatively large selection current and the other cells are traversed by a hold current $I_0$. The output stage has to supply a comparatively large current $I_1$ of, for example, 5600 $\mu$A.

When the line is not selected, the cells are traversed only by the hold current $I_0$, which is comparatively small, for example 300 $\mu$A, and is supplied to the line by a suitable current source.

It should further be noted that in general there is disposed between the base and the emitter of $T_2$ a resistor $R_2$ chosen so as to be traversed by a fraction of the current $I_0$.

During a switching operation, one of the non-selected lines passes to the selected mode, while the selected line has to be deselected. As a result of this deselection, the output transistor $T_2$ sees its current fall from $I_1$ to $I_0$. The increase in current is effected more rapidly than the decrease of current, the latter being considerably delayed by the accumulation of charges in the base of the transistor $T_2$, which has the large dimensions so that it can supply the current $I_1$.

The invention thus consists in using routing means for a suitable auxiliary current for obtaining the said evacuation of the charges from the base of the transistor $T_2$ in the known structure described above.

These current routing means comprise a first branch having a series arrangement of two diodes $D_1$ and $D_2$ connected in series and in the forward direction between the base of the transistor $T_2$ and the auxiliary current source I (point A) and a second branch comprising a diode $D_3$ arranged in the forward direction between the emitter of the transistor $T_2$ and the auxiliary current source I (point A).

These diodes may advantageously be constituted by the emitter-base junction of NPN transistors having dimensions approximately equal to those of the transistor $T_1$, whose base and collector are shortcircuited and whose emitters are arranged in the direction of the auxiliary current source I.

Figure 2A:
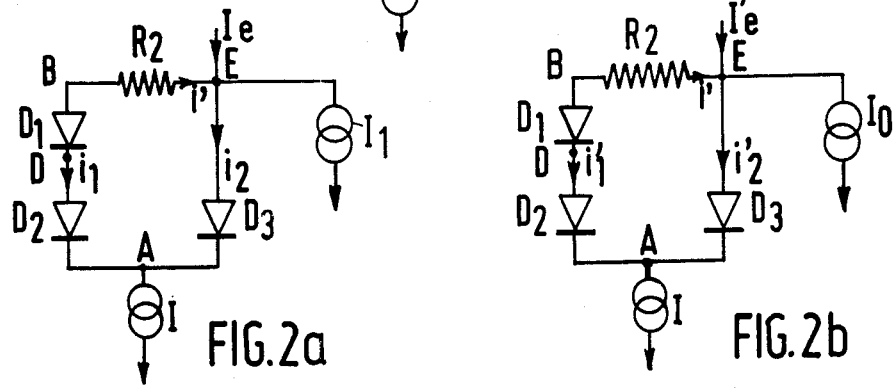
FIGS. 2a and 2b show the two current modes in the two branches of the circuit according to the invention for a selected line and a non-selected line, respectively.
Figure 2B:
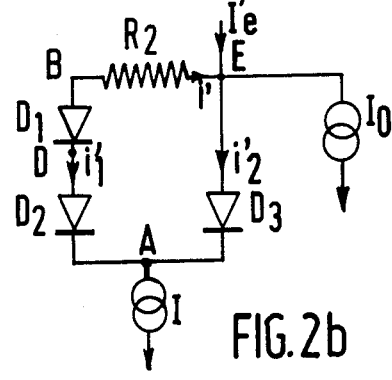

FIGS. 2a and 2b illustrate the distribution of the current between the two branches of the routing means when the line shown is selected and is not selected, respectively.

In the following part of the description, C designates the junction point between the collector of $T_0$ and the base of $T_1$, while B designates the junction point between the emitter of $T_1$ and the base of $T_2$ and E designates the output of the emitter of $T_2$ connected to the line conductor 10. The point D designates the junction point between the diodes $D_1$ and $D_2$.

In the selected state (FIG. 2a), the emitter of $T_2$ is traversed by a current $I_e$, the first branch $D_1$, $D_2$ is traversed by a current $i_1$, the second branch $D_3$ is traversed by a current $i_2$ and the memory line is traversed by a current $I_1$. The equilibrium of the currents at the points A and E gives the following relations:

$$I_e + i' = I_1 + i_2 \text{ and } i_1 + i_2 = I,$$

with $i' = V_{BE}/R_2$ with $V_{BE} \simeq 0.8$ V for a bipolar transistor.

$T_2$ is traversed by a comparatively large current. The voltage drop across its base-emitter path is therefore large and it is especially larger than that at the terminals of $D_1$, which can be traversed only by the current I supplied by the auxiliary current source which is chosen to be considerably smaller than $I_1$. The condition to be satisfied can be expressed approximately by assuming that the voltage drop across the base-emitter path of $T_2$, when the latter is traversed by the current $I_1$, is larger than that in the diode $D_1$ when the latter is traversed by the current I. Especially the relative dimension of the emitters of $D_1$ and of $T_2$ can especially be influenced, the value of the current I being essentially chosen with respect to its capability of evacuating the charge accumulated in the base of $T_2$.

The potential at the point E is now smaller than at the point D. Since $D_2$ and $D_3$ have similar current-voltage characteristics, this results in the current $i_1$ being larger than the current $i_2$ in a ratio $2^n$ if the voltage difference between D and E is $n \times 18$ mV. Consequently, when the line is in the selected state, the auxiliary current I is directed towards the first branch $D_1$, $D_2$.

By way of example, $R_2$ is chosen to be $= 4$ k$\Omega$ and hence $i' = 200$ $\mu$A, $I_1 = 5600$ $\mu$A, $I = 700$ $\mu$A. $D_1$ and $T_2$ are proportioned so that under these conditions $i_1 = 600$ $\mu$A and $i_2 = 100$ $\mu$A. Then $I_e = 5500$ $\mu$A. In this example, $i_1$ is slightly larger than one tenth of $I_e$.

When the line is deselected in response to a change of address at the input of the decoder, the current $i_1$ is utilized for discharging the charges accumulated in the base of the transistor $T_2$, which leads to an increase of the switching speed.

Figure 3A:
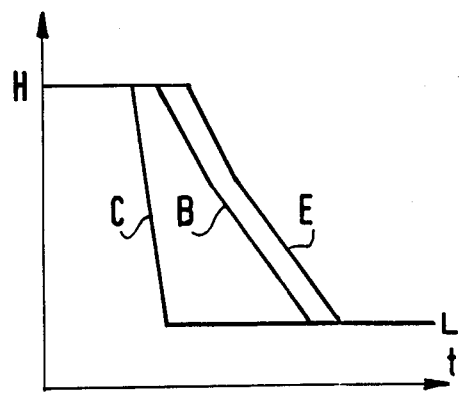
FIGS. 3a and 3b show the forms of the curves indicating the decrease of current at various points of the Darlington stage according as the latter is devoid of and is provided with the circuit according to the invention.
Figure 3B:
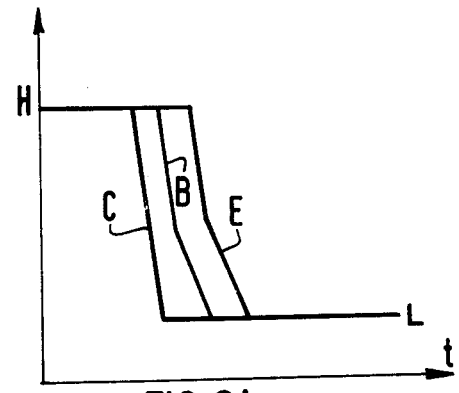

FIGS. 3a and 3b illustrate this phenomenon. In these Figures, the variations of the voltages at the points C, B and E are presented by showing them at the same voltage level. In fact, the points B and E respectively are about 800 mV lower than the points C and B.

In FIG. 3a (prior art), the voltage drop at the point C is abrupt, but on the contrary that at the point B takes place much more slowly. The voltage drop at the point E follows that at the point B with a small shift in time. The area lying between the curves at the points B and C is representative of the negative effect of the storage of charges in the base of the transistor $T_2$.

In FIG. 3b on the contrary, the current $i_1$ permits of accelerating the voltage drop at the point B, this voltage drop now being effected practically with the same slope as at the point C. The voltage drop at the point E follows, as before, that at the point B. Consequently, a saving of switching time is obtained during the deselection, which leads to the access time of the memory being shortened.

FIG. 2b shows the case in which the line is non-selected. The emitter of $T_2$ is traversed by a current $I'_e$ and the two branches are traversed by currents $i'_1$ and $i'_2$, respectively. As before, the following relations exist:

$$I'_e + i' = I_0 + i'_2 \text{ and } i'_1 + i'_2 = I.$$

As $T_2$ is a transistor of large dimensions, the voltage drop $V_{BE}$ across its base-emitter path is smaller with the same current than in the diode $D_1$. Therefore, the situation is inverted with respect to the preceding case and the voltage at the point E is slightly larger than that at the point D. The major part of the auxiliary current I passes through the diode $D_3$ constituting the second branch of the routing means. For example, with $I_0=300$ μA and the other parameters the same as before, $i'_1=200$ μA, $i'_2=500$ μA and consequently $I'_e=600$ μA.

In the non-selected mode, $I'_e=(I_0-i')+i'_2$, while in the absence of the current routing circuit according to the invention, the situation would be such that $I'_e=I_0-i'$, i.e. 100 μA in the aforementioned example.

Consequently, with the routing circuit according to the invention, the voltage drop across the base-emitter path of the transistor $T_2$ in the non-selected mode is considerably larger than according to the prior art, which reduces the tendency of the output transistor $T_2$ to approach the low level and the high level.

Let is be assumed that the high level $H_B$ at the point B is at $-800$ mV and the low level $L_B$ is at $-2000$ mV, i.e. a nominal difference of 1200 mV. With the circuit according to the prior art, the current traversing the transistor in the selected mode is 5400 μA and in the non-selected mode 100 μA, i.e. a ratio of 1 to 54. The difference between the high level $E_H$ and the low level $E_1$ at the point H is reduced by 105 mV with respect to the nominal difference and has consequently a value of 1095 mV.

With the circuit according to the invention, the ratio between the current traversing the emitter of $T_2$ in the selected mode and that in the non-selected mode is much smaller. For example, in the following description the emitter current $I_e$ in the selected mode has a value of 5500 μA and the current $I'_e$ in the non-selected mode has a value of 600 μA, i.e. a ratio or about 1 to 9.2, thus a reduction of the nominal difference of only 58 mV, which in this case has a value of 1142 mV.

According to the invention, a transistor $T_3$ can be used (FIG. 1) whose emitter is connected to the point B, whose collector is connected to ground and whose base receives a reference voltage $V_3$. This reference voltage $V_3$ is common to all the lines and has a level such that it avoids at least to a great extent the undesirable surges of the voltage of the non-selection level which may occur at the non-selected stages, which remain non-selected during a change of address corresponding, for example, to the change of line of a memory. The use of such a reference voltage is described in the French Patent Application No. 8505703 filed on 4/16/85 by the Applicant and entitled "Décodeur à diodes notamment utilisable dans une mémoire bipolaire".

The invention is not limited to the embodiment described and shown. It may be used in any switching stage having a high-current state and a low-current state which greatly differ from each other. In the case of its use in a line decoder of a memory with one switching stage per line, it should be noted that due to the necessity of using an auxiliary current source per line, it is intended more particularly for the high-speed memories having a reduced number of lines (up to about 10).

We claim:

1. A switching stage of the Darlington type comprising a first transistor having a base which is the input of the stage for reception of a logic control signal that varies between a selection level and a non-selection level, means coupling an emitter of the first transistor to a base of a second transistor, whose emitter, which constitutes an output of the stage, supplies a first current when the said logic control signal is at its selection level and a second current of lower intensity than the first current when the said logic control signal is at its non-selection level, first and second diodes connected in series in the forward direction between the base of the second transistor and an auxiliary current source having an intensity between the intensities of the first and second currents, said first and second series connected diodes constituting a first branch, and a third diode connected in the forward direction between the emitter of the second transistor and said auxiliary current source to form a second branch such that during switching of the control signal between its selection level and its non-selection level charges stored in the base of the second transistor are evacuated by the second current which passes for the major part through the first branch.

2. A switching stage as claimed in claim 1, further comprising a resistor connected between emitter and base of the second transistor having a resistance value such that a current traversing it has a value equal to a fraction of the current of the auxiliary current source.

3. A switching stage as claimed in claim 2, wherein the current of the auxiliary current source is larger than or equal to 10% of the first current current.

4. A switching stage as claimed in claim 2 at least one of the said diodes comprises the emitter-base junction of a further transistor, whose base and collector are short-circuited.

5. A switching stage as claimed in claim 2 comprising a third transistor whose emitter is coupled to the base of the second transistor and having a base that receives a reference voltage of a value such that it avoids surges of the non-selection level.

6. A switching stage as claimed in claim 1 wherein the current of the auxiliary current source is 10% or more of the first current of.

7. A switching stage as claimed in claim 1 wherein at least one of said diodes comprises a transistor connected to form a diode.

8. A switching stage as claimed in claim 1 further comprising a third transistor having an emitter coupled to the base of the second transistor and a base coupled to a source of reference voltage.

9. In a semiconductor memory including a line decoder having a switching stage of the Darlington type, said Darlington switching stage comprising a first transistor having a base which receives a logic control input signal voltage that varies between a selection level and a non-selection level, means coupling an emitter of the first transistor to a base of a second transistor having an emitter which provides a first or a second output current to a wordline of the memory when said logic control signal is at its selection level and its non-selection level, respectively, said current having a lower magnitude than the first current, wherein the improvement comprises a first branch including first and second diodes connected in series between the base of the second transistor and an auxiliary source of a magnitude lying between the magnitudes of the first and second currents, and a second branch including a third diode connected between the emitter of the second transistor and said auxiliary current source such that during switching of the control signal between its selection level and its non-selection level electric charges stored in the base of the second transistor are evacuated by the second current which passes for the major part through the first branch.

10. A semiconductor memory as claimed in claim 9 further comprising a resistor connected between the emitter and base of the second transistor with a resistance value such that a current traversing it is a fraction of the current of the auxiliary current source.

11. A semiconductor memory as claimed in claim 1 wherein the current of the auxiliary current source is equal to or greater than 10% of the first current.

12. A semiconductor memory as claimed in claim 9 further comprising a third transistor having an emitter coupled to the base of the second transistor and a base coupled to a source of reference voltage.

* * * * *

UNITED STATES PATENT AND TRADEMARK OFFICE
CERTIFICATE OF CORRECTION

PATENT NO. : 4,706,222

DATED : November 10, 1987

INVENTOR(S) : Jean-Claude Kwiatkowski, et al

It is certified that error appears in the above-identified patent and that said Letters Patent is hereby corrected as shown below:

IN THE CLAIMS

Claim 3, line 3   after "of the first current" delete "current"

Claim 4, line 1   after "claim 2" insert --wherein--

Claim 4, line 3   delete ","

Claim 6, line 3   after "first current" delete --of--

Signed and Sealed this

Ninth Day of August, 1988

Attest:

DONALD J. QUIGG

Attesting Officer    Commissioner of Patents and Trademarks